(12) United States Patent
Teshima

(10) Patent No.: US 7,585,365 B2
(45) Date of Patent: Sep. 8, 2009

(54) CORUNDUM CRYSTAL FORMED BODY

(75) Inventor: Katsuya Teshima, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 108 days.

(21) Appl. No.: 10/589,546

(22) PCT Filed: Feb. 17, 2005

(86) PCT No.: PCT/JP2005/002496

§ 371 (c)(1),
(2), (4) Date: Aug. 16, 2006

(87) PCT Pub. No.: WO2005/078169

PCT Pub. Date: Aug. 25, 2005

(65) Prior Publication Data

US 2007/0140936 A1    Jun. 21, 2007

(30) Foreign Application Priority Data

Feb. 18, 2004    (JP)    ............................... 2004-041834

(51) Int. Cl.
*C30B 29/16*    (2006.01)
(52) U.S. Cl. ............................. 117/68; 117/71; 117/74; 117/944; 501/86
(58) Field of Classification Search .................. 117/68, 117/70, 71, 73, 74, 944; 501/86
See application file for complete search history.

(56) References Cited

FOREIGN PATENT DOCUMENTS

| JP | 40-026525 | 11/1965 |
|---|---|---|
| JP | 52-117896 | 10/1977 |
| JP | 63-017297 | 1/1988 |
| JP | 06-199597 | 7/1994 |
| JP | 07-187760 | 7/1995 |
| JP | 07-277893 | 10/1995 |
| JP | 10-007450 | 1/1998 |

OTHER PUBLICATIONS

Oishi, S., et al, "Growth of emerald crystal by the evaporation of molybdenum trioxide flux," *British Ceramic Transactions*, vol. 92, No. 5, pp. 214-216, 1993.
Oishi, S., et al., "Flux growth of hexagonal bipyramidal ruby crystals," *Journal of the American Chemical Society*, vol. 126, No. 15, pp. 4768-4769, 2004.
Elwell, D., et al, "Crystal Growth from High-Temperature Solutions," Academic Press, Inc., Chap. 10, pp. 559-561, 1975.
Elwell D., "Ruby, Sapphire and Spinel," *Man-Made Gemstones*, Chap. 2, pp. 31-57, 1979.

*Primary Examiner*—Robert M Kunemund
(74) *Attorney, Agent, or Firm*—Ladas & Parry LLP

(57) ABSTRACT

A corundum crystal formed body having a corundum crystal grown directly on a base material and a production process capable of producing the corundum crystal formed body easily at low costs. The a corundum crystal formed body has a platinum base material and a corundum crystal portion formed on the platinum base material. Further, the process for producing a corundum crystal formed body involves forming a corundum crystal on a platinum base material by a flux evaporation method of heating a sample containing a raw material and a flux to precipitate a crystal. The crystal is grown by use of flux evaporation as a driving force.

16 Claims, 4 Drawing Sheets

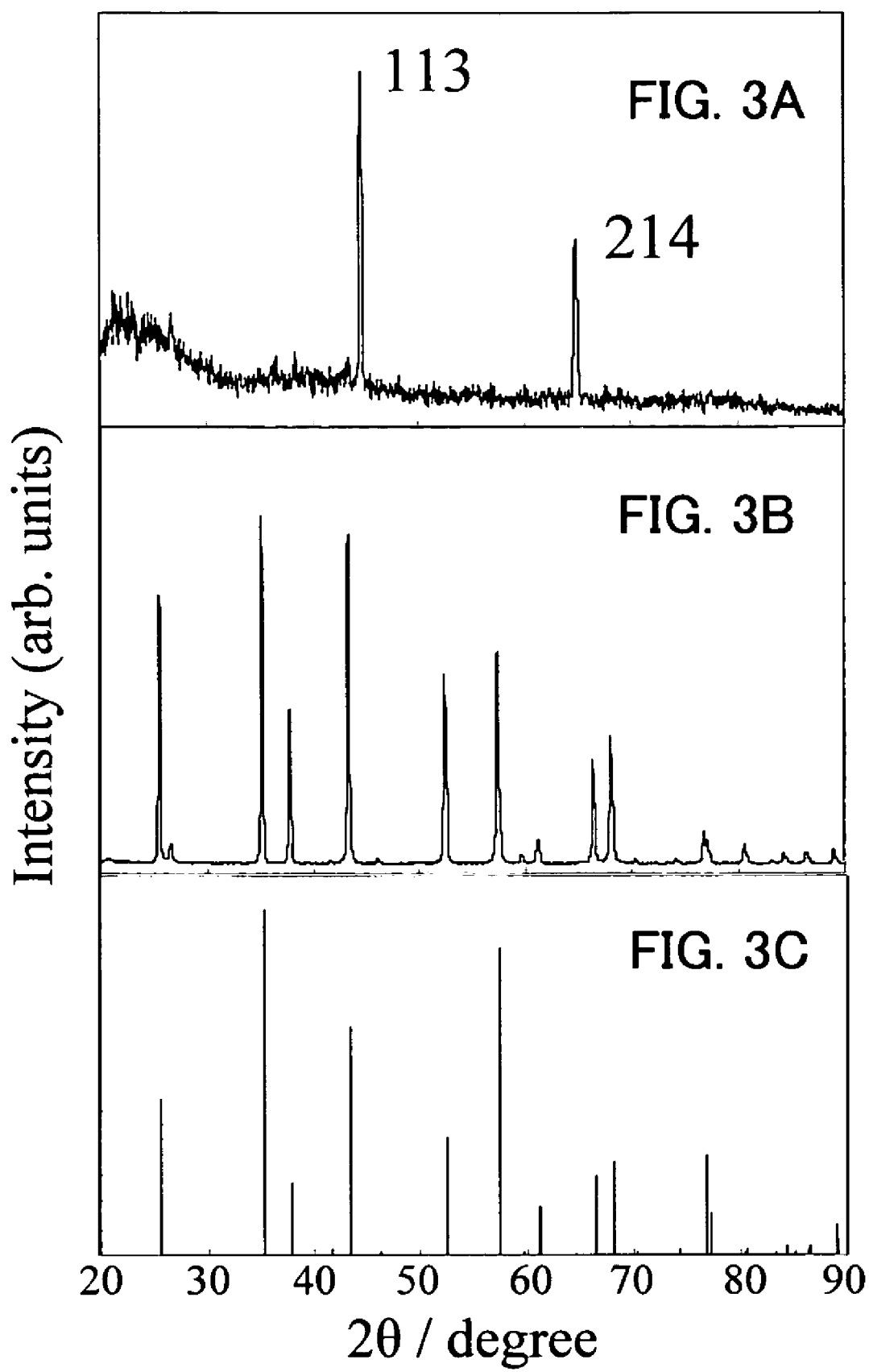

CORUNDUM CRYSTAL FORMED BODY

TECHNICAL FIELD

The present invention relates to a corundum crystal formed body which can be used as, for example, a laser-oscillating material, a highly hard bearing material, a standard material for physical property measurement, an ornament, a high-value added article for daily use, and the like.

BACKGROUND ART

In recent years, such monocrystals as are naturally present, which have a three-dimensional shape peculiar to the crystals, have been desired in various fields because of unknown properties thereof.

Examples of a method for producing a corundum crystal include (1) the flame fusion method (Verneuil's technique) of dropping raw material powder of the corundum crystal into oxygen and hydrogen flame and simultaneously growing crystal grains; (2) the flux method of mixing raw material powder of the corundum crystal with an appropriate flux, melting the mixture in a crucible, and precipitating/growing the crystal while cooling the melted solution slowly or precipitating/growing the crystal while applying temperature gradient to the solution in the crucible, or precipitating/growing the crystal while vaporizing the flux(refer to the nonpatent literatures 1 and 2); (3) the Czochralski method of melting raw material powder of the corundum crystal in a crucible, and pulling up the crystal from melt (refer to the patent documents 1 and 2); and (4) a method of forming raw material powder of the corundum crystal into a shape, and then heating the shaped powder at a high temperature in a hydrogen gas atmosphere for a long time so as to sinter the powder (refer to the patent document 3).

In the flame fusion method (1), the growth rate of the crystal is large, so that the obtained crystal cannot be made into a high quality at ease. On the other hand, the Czochralski method (3) makes it possible to produce a crystal having a high purity. Accordingly, the crystal produced can be preferably used as a laser-oscillating material or the like. However, according to these methods, a rodlike crystal is produced respectively. Thus, at the time of putting the crystal into practical use such as a laser-oscillating material, it is necessary to cut the rodlike crystal produced into a desired shape, and further the hardness of any corundum crystal is high; accordingly, a problem that costs increase arises. Furthermore, whereas the respective corundum crystal produced by these methods does not contain any impurity, the natural corundum crystals contain impurities. Accordingly, the corundum crystal thus produced can be easily distinguished and has a drawback that the crystal is very low in value as an ornament.

According to the method (4) of shaping followed by sintering, it is unavoidable to heat powder at high temperature for a long time. Thus, a large quantity of energy is needed, so as to cause a problem that costs increase.

On the other hand, it is known that according to the flux method (2), a tabular crystal can be obtained by using, as a flux, lithium oxide-lead oxide (fluoride), aluminum fluoride/sodium, lithium oxide-tungsten oxide-lead oxide (fluoride), bismuth oxide-lanthanum oxide-lead oxide (fluoride) or the like, and precipitating/growing a crystal while cooling the melted solution slowly. However, only a thin tabular crystal can be obtained. Thus, as mentioned above, there arises a problem that costs increase when the crystal is put into practical use.

Furthermore, the growth of a crystal on abase material is difficult by any methods, and particularly the direct precipitation/growth of a crystal on a base material without using a seed crystal is very difficult. Although it is possible to attach a crystal to a base material, there is a problem of easy release of the crystal.

Patent document 1: Japanese Patent Application Laid-Open (JP-A) No. 7-277893
Patent document 2: JP-A No. 6-199597
Patent document 3: JP-A No. 7-187760
Nonpatent literature 1: Elwell D., Man-made gemstones, Ellis Horwood Ltd., Chichester (1979)
Nonpatent literature 2: Elwell D., Scheel H. J., Crystal growth from high-temperature solutions, Academic Press, London (1975)

DISCLOSURE OF THE INVENTION

Problem to be Solved by the Invention

The present invention has been made in light of the above-mentioned problems, and a main object thereof is to provide a corundum crystal formed body comprising a corundum crystal directly grown on a base material and a production process capable of producing the corundum crystal formed body easily at low costs.

Means for Solving the Problem

To achieve the above-mentioned object, the present invention provides a corundum crystal formed body comprising a platinum base material and a corundum crystal portion formed on the platinum base material.

The corundum crystal formed body of the invention comprises a corundum crystal formed directly on a platinum base material, that is, a corundum crystal grown directly on a platinum base material, and thus has an advantage that unlike a crystal attached onto a platinum base material, the crystal has strong adhesion to the platinum base material and can be used in various applications.

In the present invention, the corundum crystal portion may comprise a corundum crystal having at least one crystal face selected from the group consisting of a $\{113\}$ face, a $\{012\}$ face, a $\{104\}$ face, a $\{110\}$ face, a $\{101\}$ face, a $\{116\}$ face, a $\{211\}$ face, a $\{122\}$ face, a $\{214\}$ face, a $\{100\}$ face, a $\{125\}$ face, a $\{223\}$ face, a $\{131\}$ face, and a $\{312\}$ face. In the present invention, since the corundum crystal comprising the corundum crystal portion has the above-mentioned crystal face(s) according to the invention. Thus, when the crystal is used as a laser-oscillating material or the like, it is unnecessary to apply cutting or any other processing to the crystal. Alternatively, even when cutting is applied thereto, the processing can be carried out by use of the crystal face(s) that the corundum crystal of the invention has; therefore, the crystal has an advantage that the crystal can be put into practical use at low costs. The corundum crystal of the invention has an advantage that the crystal is high in value as an ornament or the like since the crystal is a polyhedral crystal and is near natural corundum crystal.

Further, in the present invention, the corundum crystal portion may comprise a corundum crystal having a dominant crystal face other than a $\{001\}$ face. According to the invention, since the corundum crystal comprising the corundum crystal portion has a dominant crystal face other than a $\{001\}$ face, the crystal is not a crystal originating from a tabular crystal whose $\{001\}$ face is a dominant face. Thus, when the crystal is used as a laser-oscillating material or the like, cutting or any other processing is not needed to be applied. Alternatively, even when cutting is applied thereto, the processing can be carried out by use of the shape of the corundum crystal of the invention. Accordingly, the crystal can be put into practical use at low costs. Additionally, the corundum crystal of the invention has an advantage that the crystal is high in value as an ornament or the like since the crystal is near natural corundum crystal.

Furthermore, in the present invention, it is preferable that the corundum crystal is derived from a crystal having a hexagonally dipyramidal shape. This makes it possible to obtain a corundum crystal having the given crystal face(s). Thus, when the crystal is used as a laser-oscillating material or the like, processing can be applied thereto in the state that the hexagonally dipyramidal shape is used. Consequently, the crystal can be put into practical use at low costs. Since the crystal originates from the hexagonally dipyramidal crystal, the crystal is a polyhedral crystal and is near natural corundum crystal. For this reason, the value thereof as an ornament or the like becomes high.

Moreover, the corundum crystal may be colorless in the present invention. Alternatively, at least one kind of element selected from the group consisting of a chromium, an iron, a titanium, a nickel, a vanadium and a cobalt may be added as a coloring component to the corundum crystal.

Still furthermore, the present invention provides a process for producing a corundum crystal formed body, wherein a corundum crystal is formed on a platinum base material by a flux evaporation method of heating a sample containing a raw material and a flux to precipitate a crystal and grow the crystal by use of flux evaporation as driving force.

According to the present invention, a corundum crystal can grow directly on a platinum base material by using the flux evaporation method, so unlike a crystal attached onto a platinum base material, a corundum crystal formed body having strong adhesion between a base material and the crystal can be obtained and used in various applications. Moreover, according to the flux evaporation, since a crystal near natural corundum crystal is obtained, the value thereof as an ornament or the like can be made high. Furthermore, an apparatus used in the flux evaporation method is simply composed of a high-temperature furnace and a crucible. Thus, a corundum crystal formed body can easily be produced.

In the present invention, it is preferable that the corundum crystal has a hexagonally dipyramidal shape as its base shape. The use of corundum crystal having a hexagonally dipyramidal shape as its base shape makes cutting or any other processing applied thereto unnecessary when the crystal is used as a laser-oscillating material or the like. Alternatively, even when cutting is applied thereto, the processing can be carried out by use of the hexagonally dipyramidal shape. Accordingly, a corundum crystal formed body capable of being put into practical use at low costs can be produced.

It is also preferred in the invention that the flux contains a molybdenum compound. The molybdenum compound is preferably a molybdenum oxide or a compound which is heated to generate the molybdenum oxide. The use of the molybdenum compound as the flux makes it possible not to produce any tabular or needle crystal but to produce a hexagonally dipyramidal crystal selectively.

In the invention, the flux may contain an evaporation inhibitor. This makes it possible to inhibit the evaporation speed of the flux so as to inhibit the generation of polynuclei and the speed of crystal growth. Consequently, a high-quality corundum crystal can be produced.

It is also preferred in the invention that the evaporation inhibitor is an alkali metal compound. The alkali metal compound is preferably an alkali metal oxide, or a compound which is heated to generate the alkali metal oxide. The use of these compounds makes it possible to restrain the evaporation of the flux effectively, so as to produce a high-quality and large-sized corundum crystal.

It is also preferred in the invention that the mol number of the alkali metal atom in the alkali metal compound is 40% or less by mol of the total mol number of the sample. In the invention, the formation of nuclei and crystal growth are promoted by use of evaporation of the flux as a driving force; therefore, if the content of the alkali metal compound is larger than the above-mentioned range, the crystallization may be disturbed.

It is also preferred in the invention that the mol number of the raw material is 10% or less by mol of the total mol number of the sample. If the content of the raw material is larger than the above-mentioned range, the raw material is not melted into the flux at ease so that the crystallization may be disturbed.

Effect of the Invention

According to the invention, a corundum crystal having a hexagonally dipyramidal shape as its base shape can be allowed to grow directly on a platinum base material by using the flux evaporation method, and thus has an advantage that unlike a corundum crystal attached onto a platinum base material, the corundum crystal in the invention has strong adhesion to the platinum base material. Further, the crystal, when used as a laser-oscillating material or the like, can be easily processed and thus put into practical use at low costs. In addition, the crystal exhibits an effect of high value as an ornament or the like since the resultant crystal is near to a natural corundum crystal.

BRIEF DESCRIPTION OF DRAWINGS

FIGS. 3A to 3C are graphs each showing an example of the X-ray diffraction pattern of a corundum crystal used in the corundum crystal formed body of the invention.

EXPLANATION OF REFERENCES

Figure 1:
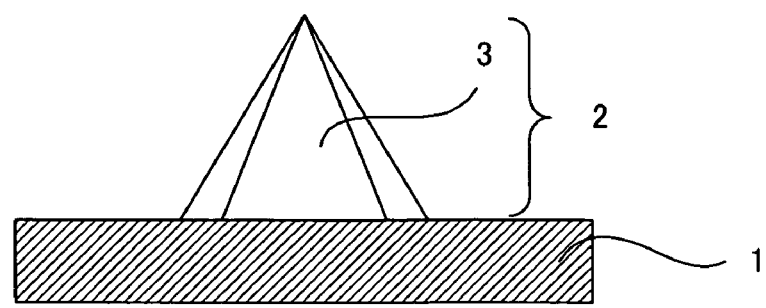
FIG. 1 is a schematic sectional view showing an example of the corundum crystal formed body of the invention.

1 . . . platinum base material
2 . . . corundum crystal portion
3 . . . corundum crystal
4 . . . sample
11 . . . mortar
12 . . . crucible
13 . . . high-temperature furnace

BEST MODE FOR CARRYING OUT THE INVENTION

The present invention includes a corundum crystal formed body and a process for producing the same. The following describes each of them in detail.

A. Corundum Crystal Formed Body

First, the corundum crystal formed body of the invention is described.

A corundum crystal formed body of the present invention comprises a platinum base material and a corundum crystal portion formed on the platinum base material.

The corundum crystal formed body of the invention is described in detail by reference to the drawings. FIG. 1 is a schematic sectional view showing an example of the corundum crystal formed body of the invention. As shown in FIG. 1, the corundum crystal formed body of the invention has a platinum base material 1 and a corundum crystal portion 2 formed on the platinum base material 1. The corundum crystal portion 2 is composed of a corundum crystal 3.

The corundum crystal formed body of the invention comprises a corundum crystal formed directly on a platinum base material, that is, a corundum crystal grown directly on a platinum base material, and thus has an advantage that unlike a crystal attached onto a platinum base material, the crystal in the invention has strong adhesion to a platinum base material and can be used in various applications.

Hereinafter, each constitution of such corundum crystal formed body is described.

1. Corundum Crystal Portion

The corundum crystal portion used in the invention is composed of a corundum crystal.

Corundum crystal is described herein. Corundum crystal has a corundum structure belonging to the trigonal system. This corundum structure has the following structure: cations (Al) regularly occupy ⅔ of hexacoordinate (octahedron) positions of a substantially hexagonal-closest-packed lattice; and $AlO_6$ octahedrons, the center of each of which is a cation (Al), partially have faces in common, and are jointed to each other in a "c" axis direction.

Corundum ($Al_2O_3$) is the most stable in alumina polymorphs. Corundum crystal having such a corundum structure has a melting point of about 2050° C., has a high hardness (Mohs hardness: 9), and is excellent in chemical resistance, abrasion resistance, and weather resistance. In a high-temperature environment also, the crystal exhibits a high electrical insulation property. Since corundum crystal has the above-mentioned nature, the crystal is used in a bearing for meters, a micro-scalpel, an optical switch element, a laser-oscillating material, and so on. Corundum crystal is converted to a crystal having a different hue by substituting Ti, Fe, Cr or the like partially for Al of corundum ($Al_2O_3$). The resultant crystal is generally called sapphire or ruby, and is used as an ornament.

The corundum crystal portion used in the invention is not particularly limited as long as it is composed of a corundum crystal, and the corundum crystal portion is composed particularly preferably of a corundum crystal having predetermined crystal faces as described below. This corundum crystal can be classified into two embodiments depending on the crystal face. The following describes each of the embodiments.

(1) First Embodiment

The first embodiment of the corundum crystal comprises a corundum crystal portion used in the present invention comprises at least one crystal face selected from the group consisting of a {113} face, a {012} face, a {104} face, a {110} face, a {101} face, a {116} face, a {211} face, a {122} face, a {214} face, a {100} face, a {125} face, a {223} face, a {131} face, and a {312} face.

Here, as the process for producing a corundum crystal, the Czochralski method, the flame fusion method, the flux method, the sintering method, and so on are known up to the present time. The corundum crystal created by the Czochralski method or the flame fusion method is yielded as a rodlike crystal. Thus, the crystal does not have a complicated shape. The corundum crystal created by the sintering method is sintered after the crystal is shaped. Therefore, in this case also, the crystal does not have a complicated shape. On the other hand, according to the flux slow-cooling method, a tabular crystal is obtained, and thus the obtained corundum crystal has crystal faces. However, the dominant face thereof is a {001} face.

As described above, corundum crystals have been hitherto obtained as rodlike or tabular crystals. It is therefore necessary to apply cutting or some other processing thereto so as to make the crystal into a desired shape at the time of using the crystal as a laser-oscillating material or the like. In addition, as described above, corundum crystals have high hardness. Consequently, an inconvenience that costs increase is caused. Further, the corundum crystal produced by the Czochralski method or the flame fusion method contains no impurities while natural corundum crystal contains impurities, and thus these can easily be distinguished from each other. Accordingly, the corundum crystal is low in value as an ornament or the like.

Figure 2:
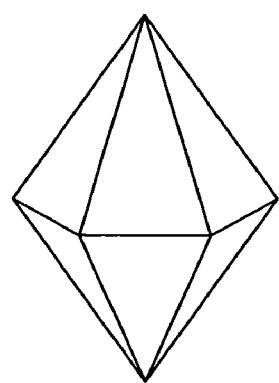
FIG. 2 is a form showing an example of a corundum crystal used in the corundum crystal formed body of the invention.

The corundum crystal in the present embodiment has given crystal face(s), and the crystal face(s) originate(s) from the hexagonally dipyramidal crystal. The hexagonally dipyramidal crystal means, for example, a corundum crystal having a shape as shown in FIG. 2. The corundum crystal originates from the hexagonally dipyramidal crystal in the present embodiment; therefore, at the time of using the crystal as a laser-oscillating material, an ornament or the like, cutting or any other processing is not applied thereto. Alternatively, even if cutting is applied thereto, the embodiment has an advantage that the crystal can be put into practical use at low costs since the processing can be performed by use of the crystal face(s) which the corundum crystal of the invention has.

The above-mentioned crystal and crystal face(s) are each identified or measured by use of an X-ray diffractometer. At this time, in the trigonal system, "a" and "c" are set to 4.759 Å and 12.993 Å, respectively, and obtained data are compared with JCPDS No. 46-1212 in the identification. An example of the X-ray diffraction pattern of crystal face(s) of the corundum crystal of the present embodiment is shown in FIG. 3A. FIG. 3B is an X-ray diffraction pattern measured by pulverizing the corundum crystal in order to identify the crystal. In the embodiment, in order for the corundum crystal to have the given crystal face(s), it is sufficient that for example a peak assigned to any one of the given crystal faces is detected as shown in FIG. 3A. FIG. 3C is an X-ray diffraction patterns of JCPDS No. 46-1212, and the X-ray diffraction patterns of FIGS. 3A to 3C were measured using a CuK α ray.

In the invention, for example, a {101} face means all faces equivalent to a (101) face, that is, a (101) face and a (011) face, or multiples thereof, such as a (202) face, a (022) face, a (303) face, a (033) face, a (404) face, a (044) face, and other faces. The same matter is applied to the other given crystal faces.

In the present embodiment, the corundum crystal has the given crystal face(s), thereby being distinguished from the corundum crystal produced by any conventional production process. For example, the corundum crystal produced by the Czochralski method does not have a complicated crystal shape and it is substantially impossible to process the crystal to have a specified crystal face even if cutting or any other processing is applied thereto. The corundum crystal produced by the flux slow-cooling method is a tabular crystal, and has a {001} face as its dominant crystal face. However, it is usually impossible to process the crystal to have a crystal face originating from a hexagonally dipyramidal crystal as described above.

It is sufficient that the corundum crystal originates from a crystal of hexagonally dipyramidal shape, and the corundum crystal may have a crystal face other than the above-mentioned crystal faces.

The wording "originates from a crystal of hexagonally dipyramidal shape" means that the corundum crystal described above may be a corundum crystal having a hexagonally dipyramidal shape as its basic shape or may be a crystal obtained by applying cutting or some other processing to a corundum crystal of hexagonally dipyramidal shape.

Figure 4A:
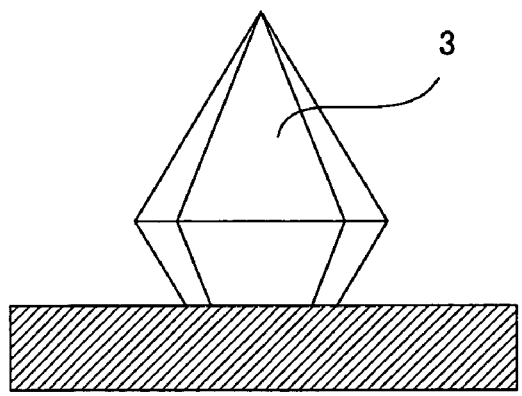
FIGS. 4A to 4D are illustrations showing the corundum crystals in the invention.
Figure 4B:
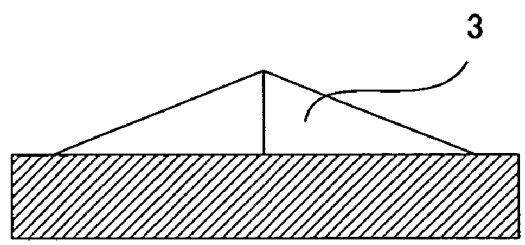
Figure 4C:
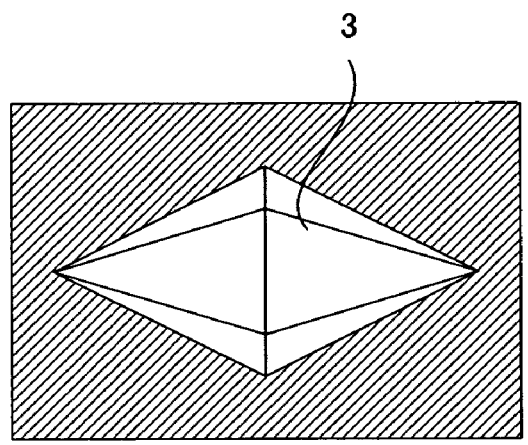
Figure 4D:
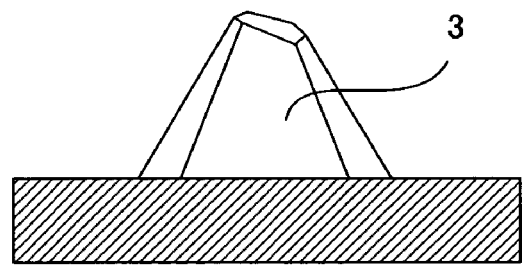

The wording "having a hexagonally dipyramidal shape as its basic shape" means, for example, a crystal basically having a hexagonally dipyramidal shape as shown in FIG. 2; and may be a hexagonally pyramidal corundum crystal 3 as shown in FIG. 1; a corundum crystal 3 whose hexagonal dipyramid is chipped in "a" axis and "b" axis directions as shown in FIG. 4A; or a corundum crystal 3 whose hexagonal dipyramid is chipped in "c" axis direction as shown in FIG. 4B. Here, FIG. 4C is a top view of FIG. 4B. Alternatively, for example, as shown in FIG. 4D, a corundum crystal 3 maybe a corundum crystal in which one or more parts of a hexagonal dipyramid are chipped so that one or more different crystal faces make its/their appearance.

The corundum crystal of the embodiment may be colorless; or may be colored by adding, to a corundum crystal, at least one kind of element selected from the group consisting of a chromium, iron, titanium, nickel, vanadium and cobalt is added as a coloring component. When the corundum crystal has been colored, the combination of the elements described above is not particularly limited, and examples include a chromium only, nickel only, vanadium only, cobalt only, or combinations of ion/titanium, nickel/chromium, nickel/chromium/iron, nickel/titanium/iron, and titanium/chromium/iron.

It is known that a corundum crystal turns to a crystal having a different hue in accordance with the kind of the additive such as a chromium, iron or titanium. For example, the crystal to which no additive is added is colorless; the crystal to which iron and titanium are added is blue; the crystal to which chromium is added is dark red, red or pink; the crystal to which nickel is added is yellow; the crystal to which vanadium is added is alexandrite color; the crystal to which nickel and chromium, nickel, or chromium and iron are added is orange; the crystal to which nickel, titanium and iron are added is yellowish green; the crystal to which titanium, chromium, and iron are added is purple; and the crystal to which cobalt is added is green. Any corundum crystal other than the dark red corundum crystal, to which chromium is added, is generally called sapphire.

It can be identified with/by EPMA (electron probe microanalizer), XPS (X-ray photoelectron spectrometry) or EDX (energy dispersive X-ray analysis), that the above-mentioned element(s) is/are added.

The content of the above-mentioned element in the corundum crystal varies depending on the type of the element, and may be a very small and is not particularly limited as long as the element is contained in an amount to color the corundum crystal.

The composition of the respective corundum crystal mentioned above is not limited to a crystal having a stoichiometric composition, and maybe a crystal not having a stoichiometric composition. The corundum crystal formed body of the embodiment is preferably produced by the flux evaporation method, as will be described later, for the following reason: when the corundum crystal is produced by the flux evaporation method, the crystal may contain, as an impurity, an element contained in the flux. The impurity content in the corundum crystal is usually an extremely small amount which is 1% or less by mol.

In the embodiment, the corundum crystal formed body is preferably produced by the flux evaporation method for the following reasons: the apparatus used in the flux evaporation method is simply composed of a high-temperature furnace and a crucible, and thus a hexagonally dipyramidal corundum crystal can easily be provided; in accordance with the kind of the used flux, it is possible not to produce a tabular crystal or needle crystal but to produce a hexagonally dipyramidal crystal selectively; and the corundum crystal produced by the flux evaporation method may contain, as an impurity, an element contained in the flux, and thus a crystal containing the impurity can be produced in the same manner as in the case of natural corundum crystal, whereby the corundum crystal has an advantage that the crystal thus produced is high in value as an ornament or the like since the crystal is near natural crystal.

The method of producing the corundum crystal, such as the flux evaporation method, will be described later in the column "B. A process for producing a corundum crystal formed body". Thus, description thereof is not repeated herein.

The corundum crystal of the embodiment may be a crystal into which an impurity is intentionally incorporated. As described above, the incorporation of the impurity gives an advantage that the crystal can be made near to natural crystal and is high in value as an ornament or the like.

(2) Second Embodiment

The second embodiment of the corundum crystal comprising the corundum crystal portion used in the invention is a corundum crystal having a dominant crystal face other than a {001} face.

As described about the first embodiment, the corundum crystal produced by the conventional Czochralski method, flame fusion method or sintering method does not have any complicated crystal shape. Since the flux slow-cooling method gives a tabular crystal, the corundum crystal has crystal faces; however, the dominant crystal face thereof is a {001} face.

In the present embodiment, the corundum crystal of the present embodiment is a corundum crystal having a dominant crystal face other than a {001} face. Such a crystal face does not originate from any tabular crystal, but originates from a hexagonally dipyramidal crystal in the same manner as in the first embodiment. Since the corundum crystal in the embodiment has a dominant crystal face other than a {001} face and originates from a hexagonally dipyramidal crystal, cutting or any other processing is not applied thereto when the crystal is used as a laser-oscillating material, ornament or the like. Alternatively, even if cutting is applied thereto, the embodiment has an advantage that the processing can be performed by use of the crystal face(s) which the corundum crystal has, so that the crystal can be put into practical use at low costs.

The wording "having a dominant crystal face other than a {001} face" means the matter of having no {001} face, or the following: when a crystal has a {001} face, a peak is present which has a larger intensity than the peak assigned to the {001} face in the X-ray diffraction pattern thereof. The dominant crystal face other than a {001} face is preferably any one of the given crystal faces described about the first embodiment.

The other matters of the corundum crystal are the same as described about the first embodiment. Thus, description thereof is not repeated herein.

2. Platinum Base Material

Next, the platinum base material used in the invention is described. The platinum base material used in the invention may be made of a platinum element or a platinum-containing alloy. The platinum base material may comprise a base body on which a platinum element film or a platinum-containing alloy film is formed. While the platinum base material composed of a platinum element is expensive, the platinum base material composed of a platinum alloy or the platinum base material comprising a platinum film or a platinum alloy film formed on a base body is advantageous in respect of low costs.

When the platinum base material is composed of a platinum alloy, the alloy components of this platinum alloy are not particularly limited as long as they are elements poor in reactivity to the corundum crystal. For example, palladium or the like can be cited. The amount of elements such as palladium or the like, based on platinum, is preferably 50% or less.

When the platinum base material is a base body on which a platinum element film or a platinum alloy film is formed, the base body used is not particularly limited as long as a platinum element film or a platinum alloy film can be formed and formation of the corundum crystal is not adversely affected, and the base body is preferably the one durable to the maximum keeping temperature described later in the column of a heating/vaporizing step in "B. Process for producing a corundum crystal formed body". Such base body includes sapphire, alumina, alumina-silica, silicon carbide, or the like.

The platinum element film or the platinum alloy film is formed preferably on the whole surface of the base body. This is because when the platinum element film or the platinum alloy film is not formed on the whole surface of the base body, a part of constituent materials of the base body can be eluted from the part of the base body not coated with the platinum element film or the platinum alloy film in preparation of the corundum crystal formed body of the invention by the flux evaporation method, resulting in adverse influence on formation of the corundum crystal. Platinum is poor in reactivity to the corundum crystal and is thus considered not to influence formation of the corundum crystal.

The method of forming the platinum element film or the platinum alloy film includes general deposition methods such as spattering, ion plating, and vapor deposition. The thickness of the platinum element film or the platinum alloy film is not particularly limited as long as the whole surface of the base body is coated with the film, but in consideration of costs, the thickness is preferably thinner.

The shape of the platinum base material used in the invention is not particularly limited, and can be suitably selected depending on applications of the corundum crystal formed body. For example, the platinum base material may be plate-shaped, rod-shaped, wire-shaped, ring-shaped, cubic, convexoconcave-shaped, spherical, 3-dimensional, subulate-shaped (conical, pyramidal, or the like), or pillar-shaped (cylindrical, square pillar-shaped, or the like). The platinum base material may be hollow between chatons of a ring or inside of a mesh cage.

B. A Process for Producing a Corundum Crystal Formed Body

Next, the following describes the process for producing a corundum crystal formed body of the invention.

The process for producing a corundum crystal formed body of the invention is characterized in that a corundum crystal is formed on a platinum base material by a flux evaporation method of heating a sample containing a raw material and a flux to precipitate a crystal and grow the crystal by use of flux evaporation as driving force.

The flux method is one of the solution methods, and is also called the fusing agent method. When a crystal is grown by the flux method, a salt or oxide which becomes the flux is mixed with a raw material which becomes a solute and then the mixture is heated and melted. Thereafter, the solution is turned into a supersaturated state while the solution is slowly cooled or the flux is vaporized. In this way, a crystal is grown. In accordance with difference in the method for producing this supersaturated state, the flux method is roughly classified into the flux evaporation method, the flux slow-cooling method, and the flux temperature gradient method.

Figure 5A:
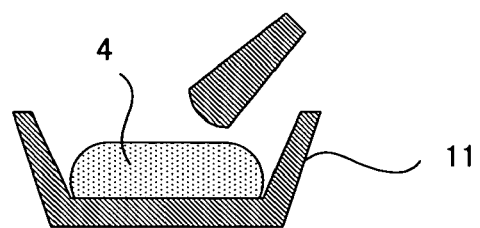
FIGS. 5A to 5D is a process chart showing an example of the process of the invention for producing the corundum crystal formed body of the invention.
Figure 5B:
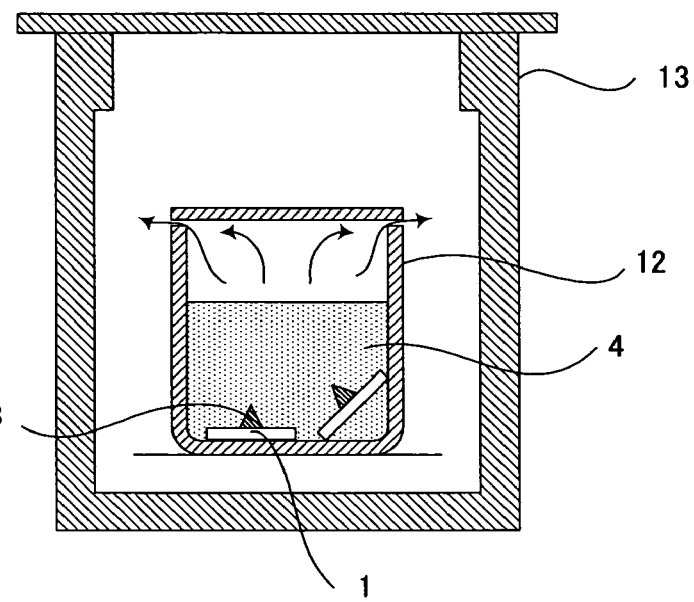
Figure 5C:
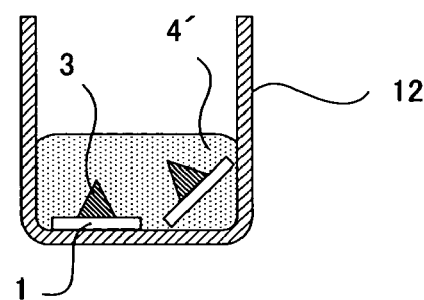

Among those described above, the flux evaporation method is used in the invention. The flux evaporation method is a method of promoting the formation of nuclei and crystal growth by use of the evaporation of a flux as a driving force. As shown in, for example, FIG. 5B, a crucible 12 displaced with a sample 4 containing a flux and a raw material, and a platinum base material 1, are set in a high-temperature furnace 13, and then heated to vaporize the flux in the sample 4, thereby precipitating and growing a corundum crystal 3 on the platinum base material 1, whereby a sample 4' containing a corundum crystal formed body having the platinum base material 1 and the corundum crystal 3 is obtained as shown in FIG. 5C. This remaining sample 4' is dissolved in an appropriate medium, whereby the corundum crystal formed body having the platinum base material 1 and the corundum crystal 3 can be separated.

The mechanism of forming the corundum crystal on the platinum base material is estimated as follows. That is, an aluminum oxide particle remained without melting even by heating serves as a nucleus on which a crystal is to be formed. In this case, the crystal precipitated in the vicinity of the platinum base material comes to be contacted with the platinum base material in the crystal growth process. The crystal contacted with the platinum base material cannot grow any more toward the direction where the platinum base material is present, and thus the crystal will grow in other directions. In this manner, a corundum crystal adheres onto the platinum base material to allow the crystal to further grow, thus enabling growth of the corundum crystal on the platinum base material.

In the invention, the corundum crystal is precipitated to grow not only on the platinum base material as described above, but also on a wall surface of the crucible in some cases. The crucible used in the invention is usually a platinum crucible as described later, and thus the corundum crystal is also precipitated to grow on the wall surface of the platinum crucible through the same mechanism as described above. Even if the corundum crystal has grown on the wall surface of the platinum crucible, the corundum crystal can grow on the platinum base material, and thus the corundum crystal formed body can be obtained in the invention.

The following is known as the process for producing a corundum crystal using the flux method: by the flux slow-cooling method, in which a solution is turned into a supersaturated state while the solution is slowly cooled, a crystal is grown and a tabular crystal can be obtained, using a lead-based flux such as lithium oxide-lead oxide (fluoride), lithium oxide-tungsten oxide-lead oxide (fluoride), or bismuth oxide-lanthanum oxide-lead oxide (fluoride). However, the crystal obtained by this method is only a thin tabular crystal. Thus, a large-sized crystal having a high quality is not easily produced. It is therefore necessary to cut the tabular crystal into a desired shape when the crystal is used as a laser-oscillating material or the like. Furthermore, an inconvenient that costs increase is caused since the corundum crystal has a high hardness.

Although the flux method has such a problem, an element contained in a flux may be contained as an impurity in the crystal according to the flux method. Unlike, the Czochralski method and others, the resultant corundum crystal contains the impurity, and can be made near to natural corundum crystal; thus, the flux method has an advantage that the resultant crystal is high in value as an ornament or the like.

In the invention, the flux evaporation method is used, whereby a corundum crystal having a hexagonally dipyramidal shape as its basic shape can be produced, as shown in, for example, FIG. 1. It is accordingly possible to provide, at low costs, a high value added corundum crystal which is easily processed when the crystal is put into practical use. It is sufficient that the apparatus used in the flux evaporation method has a high-temperature furnace 13 and a crucible 12 as shown in FIG. 5B. Thus, the apparatus is simple. In the flux evaporation method, a corundum crystal is obtained by vaporizing a flux to precipitate and grow a crystal, and then dissolving the remaining sample into an appropriate medium. Consequently, the production process therefor is simple. As described above, a corundum crystal may contain, as an impurity, an element contained in the flux according to the flux evaporation method, and thus a crystal near natural corundum crystal is obtained. Therefore, a corundum crystal high in value as an ornament or the like can be produced.

In the present invention, the corundum crystal having a hexagonally dipyramidal shape as its basic shape is not limited to a special kind as long as the crystal basically has a hexagonally dipyramidal shape as shown in, for example, FIG. 2. For example, the corundum crystal may be a hexagonally pyramidal corundum crystal 3 as shown in FIG. 1, a corundum crystal 3 whose hexagonal dipyramid is chipped in "a" axis and "b" axis directions as shown in FIG. 4A, or a corundum crystal 3 whose hexagonal dipyramid is chipped in "c" axis direction as shown in FIG. 4B. Here, FIG. 4C is a top view of FIG. 4B. Alternatively, for example, as shown in FIG. 4D, a corundum crystal maybe a corundum crystal 3 in which one or more parts of a hexagonal dipyramid are chipped so that one or more different crystal faces make its/their appearance.

Figure 5D:
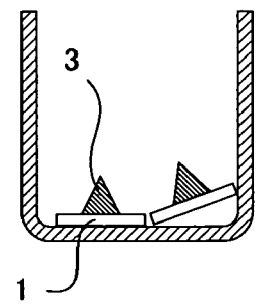

FIGS. 5A to 5D is a process chart showing an example of the process for producing a corundum crystal formed body of the invention. As shown in FIGS. 5 A to 5D, the process for producing a corundum crystal formed body of the invention comprises a sample-preparing step of stirring a flux and a raw material in a mortar 11 to prepare a sample 4 (FIG. 5A); a heating/vaporizing step of setting a crucible 12 displaced with the sample 4 and a platinum base material 1 into a high-temperature furnace 13, heating, and further keeping the sample and the platinum base material at high temperature to vaporize the flux (FIG. 5B); a cooling step of cooling the sample 4' fused in the heating/vaporizing step (FIG. 5C); and a separating step of dissolving a sample 4' remained after the heating/vaporizing step and the cooling step into an appropriate medium so as to separate a corundum crystal formed body comprising the platinum base material 1 and a corundum crystal 3(FIG. 5D).

The following describes each of the steps of such a process for producing a corundum crystal formed body.

1. Sample-preparing Step

In the process for producing a corundum crystal formed body of the invention, the sample-preparing step is performed first, in which a flux and a raw material are stirred to prepare a sample.

In the present step, the method for stirring the flux and the raw material is not particularly limited as long as the method is a method making it possible to stir them into a homogeneous form. For example, a method of stirring the flux and the raw material in a mortar can be used.

The sample used in the invention is a sample containing a flux and a raw material. The following describes the flux and the raw material separately.

(1) Flux

The flux used in the invention is not particularly limited if the flux is a substance which evaporates in the heating/vaporizing step which will be described later, and which is dissolved in an appropriate medium in the separating step which will be also described later. The flux preferably contains a molybdenum compound. When the flux contains the molybdenum compound, it is possible not to produce a tabular or needle corundum crystal but to produce selectively a corundum crystal having a hexagonally dipyramidal shape as its basic shape.

As such a molybdenum compound, there can be used the molybdenum oxide, or a compound which is heated in the heating/vaporizing step, which will be described later, to generate the molybdenum oxide. Examples of the compound, which is heated to generate the molybdenum oxide, include a molybdenum carbonate, a molybdenum sulfate, a molybdenum nitrate, a molybdenum hydroxide, and hydrates thereof. Of these, the molybdenum oxide is preferably used in the invention.

In the invention, the flux may contain an evaporation inhibitor. This makes it possible to inhibit the evaporation speed of the flux to suppress the generation of polynuclei and the speed of crystal growth, whereby a high-quality corundum crystal can be produced.

On the other hand, when the flux does not contain the evaporation inhibitor, the speed of nuclei formation is large so that a large number of nuclei are formed. Consequently, a great number of corundum crystals can be produced on the platinum base material.

The evaporation inhibitor is not particularly limited if the inhibitor is a substance which can inhibit the evaporation of the flux and is dissolved in an appropriate medium in the separating step, which will be described later. In the invention, it is preferred to use an alkali metal compound. The use of the alkali metal compound makes it possible to inhibit the evaporation of the flux effectively and produce a high-quality and large-sized corundum crystal.

As such an alkali metal compound, there can be used an alkali metal oxide or a compound which is heated in the heating/vaporizing step, which will be described later, to generate the alkali metal oxide. Examples of the compound, which is heated to generate the alkali metal oxide, include an alkali metal carbonate, an alkali metal sulfate, an alkali metal nitrate, an alkali metal hydroxide, and hydrates thereof. In the invention, preferred is at least one kind of alkali metal oxide selected from the group consisting of $Li_2O$, $Na_2O$ and $K_2O$ among the above. Specifically, $Li_2CO_3$, $Na_2CO_3$, $K_2CO_3$ or the like can be cited.

About the content of the alkali metal compound, the mol number of the alkali metal atom in the alkali metal compound is preferably 40% or less by mol of the total mol numbers of the sample; more preferably 30% or less by mol thereof; and in particular preferably 20% or less by mol thereof. In the invention, the formation of nuclei and crystal growth are promoted by use of the evaporation of the flux as a driving force; therefore, if the content of the alkali metal compound is larger than the above-mentioned range, the crystallization may be hindered.

(2) Raw Material

The following describes the raw material used in the invention. The raw material used in the invention is varied depending on additives in the corundum crystal as described in the above-mentioned column "A. Corundum crystal formed body". For example, when a colorless corundum crystal is formed, the raw material may be an aluminum compound. When a chromium-added corundum crystal is formed, the raw material used is an aluminum compound and a chromium compound. The following describes, as examples, the colorless corundum crystal, the chromium-added corundum crystal, and the iron and titanium-added corundum crystal.

(Colorless Corundum Crystal)

When the colorless corundum crystal is formed in the invention, the raw material may be an aluminum compound.

As the aluminum compound, there can be used an aluminum oxide, or a compound which is heated in the heating/vaporizing step, which will be described later, to generate the aluminum oxide. Examples of the compound, which is heated to generate the aluminum oxide, include an aluminum hydroxide, an aluminum sulfate, an aluminum carbonate, an aluminum nitrate, and hydrates thereof. Of these, the aluminum oxide is preferably used in the invention.

About the content of the raw material in the invention, the mol number of the raw material is preferably 10% or less by mol of the total mol number of the sample. If the content of the raw material is larger than this range, the flux is not easily dissolved so that the crystallization may be hindered. Since the crystal is formed as long as the raw material is contained by only a small amount, the lower limit of the content of the raw material is not particularly limited.

(Chromium-added Corundum Crystal)

When the chromium-added corundum crystal is formed, the raw material used in the invention is an aluminum compound and a chromium compound.

The chromium compound is not particularly limited if the compound is a compound which is melted in the heating/vaporizing step, which will be described later. The compound is preferably a compound which is heated to generate a chromium ion. Examples of the compound, which is heated to generate a chromium ion, include a chromium oxide, a chromium hydroxide, a chromium sulfate, a chromium carbonate, a chromium nitrate, and hydrates thereof. Of these, the chromium oxide is preferably used in the invention.

The mixing ratio of the aluminum compound to the chromium compound is not particularly limited as long as the chromium compound is added in an amount to color the corundum crystal. In the case of using, for example, an aluminum oxide and a chromium oxide as the raw material, the adding amount of the chromium oxide should be 5% or less by weight of the aluminum oxide weight. The amount is preferably 2% or less by weight thereof, and more preferably 1% or less by weight thereof. This is because when the mixing ratio is in the above range, the corundum crystal is colored vivid dark red.

About the mixing ratio between the aluminum compound and the raw material, it is the same as the ratio described in the above-mentioned column of the colorless corundum crystal. Thus, description is not repeated herein.

(Iron and Titanium-added Corundum Crystal)

When the iron and titanium-added corundum crystal is formed, the raw material used in the invention is an aluminum compound, an iron compound and a titanium compound.

The iron compound is not particularly limited if the compound is a compound which is melted in the heating/vaporizing step, which will be described later. The compound is preferably a compound which is heated to generate an iron ion. Examples of the compound, which is heated to generate an iron ion, include an iron oxide, an iron hydroxide, an iron sulfate, an iron carbonate, an iron nitrate, an iron chloride, an iron citrate, an iron phosphate, an iron fluoride, an iron iodide, an iron oxalate, and hydrates thereof. Of these, the iron oxide is preferably used in the invention. In this case, the valence of iron in the iron oxide may be bivalent or trivalent. Bivalent iron and trivalent iron may be mixed.

Further, the titanium compound is not particularly limited if the compound is a compound which is melted in the heating/vaporizing step, which will be described later. The compound is preferably a compound which is heated to generate a titanium ion. Examples of the compound, which is heated to generate a titanium ion, include a titanium oxide, a titanium nitride, a titanium tetraisopropoxide, a titanium oxalate, a titanium sulfide, a titanium bromide, a titanium chloride, and hydrates thereof. Of these, the titanium oxide is preferably used in the invention. In this case, the valence of a titanium in the titanium oxide includes bivalence, trivalence and quadrivalence. About the valence of the titanium, a single valence or mixed valences therefrom are permissible.

The mixing ratio between the aluminum compound, the iron compound and the titanium compound is not particularly limited if the iron compound and the titanium compound are added in an amount which makes it possible to color the corundum crystal. In the case of using, for example, an aluminum oxide, an iron oxide and a titanium oxide as the raw material, the total adding amount of the iron oxide and the titanium oxide should be 5% or less by weight of the aluminum oxide weight; preferably 2% or less by weight thereof; and more preferably 1% or less by weight thereof. By setting the mixing ratio into the above-mentioned range, the corundum crystal is colored into vivid blue color.

The mixing ratio between the iron compound and the titanium compound is varied by the valences of the iron and the titanium. Usually, the compounds are mixed to set the weight ratio between the iron element and the titanium element as follows: Fe:Ti=1:0.05-20. The compounds are preferably mixed to set the ratio to 1:0.07-15, in particular, 1:0.1-10. By setting the mixing ratio into the above-mentioned range, a corundum crystal exhibiting vivid blue color can be obtained.

The content of the aluminum compound and the raw material is the same as described in the above-mentioned column of the colorless corundum crystal. Thus, description is not repeated herein.

(Other)

When a nickel-, vanadium- or cobalt-added corundum crystal is formed in the invention, a nickel compound, a vanadium compound or a cobalt compound may be used.

The nickel compound is not particularly limited if the compound is a compound which is melted in the heating/vaporizing step, which will be described later. The compound is preferably a compound which is heated to generate a nickel ion. Examples of the compound, which is heated to generate a nickel ion, include a nickel acetate, a nickel carbonate, a nickel chloride, a nickel hydroxide, a nickel iodide, a nickel nitrate, a nickel oxide, a nickel sulfaminate, a nickel sulfate, and hydrates thereof. Of these, the nickel oxide is preferably used in the invention. In this case, the valence of the nickel in the nickel oxide may be bivalent or trivalent. Bivalent nickel and trivalent nickel may be mixed.

Further, the vanadium compound is not particularly limited if the compound is a compound which is melted in the heating/vaporizing step, which will be described later. The compound is preferably a compound which is heated to generate a vanadium ion. Examples of the compound, which is heated to generate a vanadium ion, include a vanadium carbide, a vanadium chloride, a vanadium oxide, a vanadium oxysulfate, a vanadium oxalateoxidehydrate, and hydrates thereof. Of these, the vanadium oxide is preferably used in the invention. In this case, the valence of the vanadium in the vanadium oxide includes trivalence, quadrivalence and quinquevalence. About the valence of vanadium, a single valence or mixed valences therefrom are permissible.

Furthermore, the cobalt compound is not particularly limited if the compound is a compound that is melted in the heating/vaporizing step, which will be described later. The compound is preferably a compound which is heated to generate a cobalt ion. Examples of the compound, which is heated to generate a cobalt ion, include a cobalt bromide, a cobalt chloride, a cobalt citrate, a cobalt fluoride, a cobalt gluconate, a cobalt hydroxide, a cobalt iodide, a cobalt nitrate, a cobalt oxalate, a cobalt oxide, a cobalt phosphate, a cobalt stearate, a cobalt sulfate, a cobalt sulfide, and hydrates thereof. Of these, the following are preferably used in the invention: the cobalt citrate, the cobalt fluoride, the cobalt gluconate, the cobalt hydroxide, the cobalt iodide, the cobalt oxalate, the cobalt oxide, the cobalt phosphate, and the cobalt stearate. It is particularly preferred to use the cobalt oxide, the cobalt hydroxide, the cobalt stearate and the cobalt phosphate. In this case, the valence of cobalt in the cobalt compound may be bivalent or trivalent. A bivalent cobalt and a trivalent cobalt may be mixed.

The amount of the nickel compound, vanadium compound or cobalt compound described above is not particularly limited as long as the compound is added in an amount to color the corundum crystal.

In the invention, the above-mentioned aluminum compound can be used in combination with the iron compound, titanium compound, nickel compound, vanadium compound or cobalt compound in various ways, and the mixing ratio between these compounds is suitably selected depending on applications of the corundum crystal formed body.

(3) Others

In the invention, an impurity may be contained into the above-mentioned sample. This makes it possible to produce a crystal near natural crystal and yield a corundum crystal high in value as an ornament or the like.

2. Heating/Vaporizing Step

The following describes the heating/vaporizing step of the invention. The heating/vaporizing step in the invention is a step of heating the sample containing the flux and the raw material and further keeping the sample at high temperature to vaporize the flux.

In the present step, the sample and the platinum base material prepared in the sample-preparing step is displaced into a crucible, and then the crucible is covered with a lid. As shown in, for example, FIG. 5B, a crucible 12 into which the sample 3 and the platinum base material 1 are displaced is set in a high-temperature furnace 13. Next, the temperature thereof is raised to a maximum keeping temperature, and the sample is kept at the temperature for a given time, thereby vaporizing the flux in the sample 4 and promoting nuclei formation and crystal growth by use of the evaporation of the flux as a driving force. In this way, a corundum crystal 3 is produced on the platinum base material 1.

The maximum keeping temperature in the step is not particularly limited if the temperature is a temperature at which the sample is melted. Specifically, the temperature is preferably from 950 to 1300° C.; more preferably from 975 to 1250° C.; and in particular preferably from 1000 to 1200° C.

The temperature-raising rate when the maximum keeping temperature is set is not particularly limited if the rate is a rate making it possible to heat the sample uniformly. Furthermore, the time for keeping the sample at the maximum keeping temperature is not particularly limited if the time is a time making it possible to grow the crystal sufficiently.

The crucible used in the step is not particularly limited if the crucible is a crucible which can resist the maximum keeping temperature and is low in reactivity with the sample. Usually, a platinum crucible is used.

The platinum base material is the same as described above in the column of "A. Corundum crystal formed body", and thus description thereof is not repeated herein.

The method of displacing the platinum base material varies depending on the shape, size or the like of the platinum base material and is not particularly limited as long as the platinum base material is displaced so as to contact with the sample in the crucible. It is possible to employ, for example, a method wherein the platinum base material is displaced along the wall surface or bottom of the crucible and then the sample is filled into the crucible, or the sample is filled into the crucible and then the platinum base material is displaced in the sample. For example, when a wire-shaped platinum base material is used, the wire can be suspended over the crucible thereby allowing the sample to contact with the platinum base material.

3. Cooling Step

The following describes the cooling step in the invention. The cooling step in the invention is a step of cooling the sample melted in the heating/vaporizing step.

In the step, the crucible 12 displaced with the sample 4 and the platinum base material 1 is taken out from the high-temperature furnace 13 as shown in, for example, FIG. 5B, and then the crucible 12 is cooled down to a room temperature, as shown in FIG. 5C.

The method for the cooling may be any method that makes it possible to cool the sample down to a room temperature, and is a method of cooling the crucible naturally, or the like.

4. Separating Step

The following describes the separating step in the invention. The separating step in the invention is a step of dissolving the sample remained after the heating/vaporizing step and the cooling step into an appropriate medium, thereby separating the corundum crystal formed body.

After the cooling step, the sample 4' in which the corundum crystal formed body comprising the platinum base material 1 and the corundum crystal 3 is taken in is remained the crucible, as shown in FIG. 5C. In the step, this remained sample is dissolved into an appropriate medium, whereby only the corundum crystal formed body can easily be separated.

The medium used to dissolve the remained sample is not particularly limited if the medium is a medium in which the remained sample other than the corundum crystal and the platinum base material can be dissolved without affecting the corundum crystal. Examples thereof include cool water, warm water, and hot water.

Other matters of the corundum crystal produced by the process for producing a corundum crystal formed body of the invention are the same as described in the above-mentioned column of "A. Corundum crystal formed body". Thus, description thereof is not repeated herein.

5. Others

In the invention, as mentioned above, the corundum crystal may grow on the wall surface or the like of the crucible. In this case, the crucible to which the corundum crystal adheres can be removed from the wall surface or the like of the crucible by acid fusing treatment with an acid fusing agent such as potassium hydrogensulfate. The crucible can thereby be repeatedly used.

The invention is not limited to the above-mentioned embodiments. The embodiments are illustrative, and any embodiment which has a construction which is substantially equivalent to the technical conception recited in the claims of the invention and produces similar effects or equivalent thereof is included in the technical scope of the invention.

EXAMPLES

Hereinafter, the invention is described specifically by reference to the Examples.

Example

An aluminum oxide (1.5 g), a chromium oxide (0.008 g), a molybdenum oxide (28.5 g), and a lithium carbonate (1.5 g) were weighed, and then put into a mortar. This blended sample was dry-mixed in the mortar for about 20 minutes. Thereafter, the blended sample and a platinum plate (thickness 0.5 mm; 1 by 1 cm square) were filled into a platinum crucible, and the crucible was covered with a lid and set in an electric furnace. The electric furnace was heated to 1100° C. at a rate of 45° C. per hour, and kept at the temperature for 5 hours. After the furnace was kept, the crucible was taken out from the electric furnace, and naturally cooled down to the room temperature. The crucible cooled down to the room temperature was put into warm water so as to separate/collect a corundum crystal formed body. The corundum crystal of the resultant corundum crystal formed body was a transparent, dark red, hexagonally pyramidal crystal to which chromium had been added.

The invention claimed is:

1. A corundum crystal formed body comprising a platinum base material and a corundum crystal portion formed directly on the platinum base material, wherein the corundum crystal is colorless.

2. The corundum crystal formed body according to claim 1, wherein the corundum crystal portion comprises a corundum crystal having at least one crystal face selected from the group consisting of a {113} face, a {012} face, a {104} face, a {110} face, a {101} face, a {116} face, a {211} face, a {122} face, a {214} face, a {100} face, a {125} face, a {223} face, a {131} face, and a {312} face.

3. The corundum crystal formed body according to claim 1, wherein the corundum crystal portion comprises a corundum crystal having a dominant crystal face other than a {001} face.

4. The corundum crystal formed body according to claim 2, wherein the corundum crystal is derived from a crystal having a hexagonally dipyramidal shape.

5. The corundum crystal formed body according to claim 3, wherein the corundum crystal is derived from a crystal having a hexagonally dipyramidal shape.

6. A process for producing a corundum crystal formed body, wherein a corundum crystal is formed on a platinum base material by a flux evaporation method of heating a sample containing a raw material and a flux to precipitate a crystal and grow the crystal by use of flux evaporation as driving force.

7. The process for producing a corundum crystal formed body according to claim 6, wherein the corundum crystal has a hexagonally dipyramidal shape as its base shape.

8. The process for producing a corundum crystal formed body according to claim 6, wherein the flux contains a molybdenum compound.

9. The process for producing a corundum crystal formed body according to claim 7, wherein the flux contains a molybdenum compound.

10. The process for producing a corundum crystal formed body according to claim 8, wherein the molybdenum compound is a molybdenum oxide, or a compound which is heated to generate the molybdenum oxide.

11. The process for producing a corundum crystal formed body according to claim 9, wherein the molybdenum compound is a molybdenum oxide, or a compound which is heated to generate the molybdenum oxide.

12. The process for producing a corundum crystal formed body according to claim 8, wherein the flux contains an evaporation inhibitor.

13. The process for producing a corundum crystal formed body according to claim 12, wherein the evaporation inhibitor is an alkali metal compound.

14. The process for producing a corundum crystal formed body according to claim 13, wherein the alkali metal compound is an alkali metal oxide, or a compound which is heated to generate the alkali metal oxide.

15. The process for producing a corundum crystal formed body according to claim 14, wherein a mol number of an alkali metal atom in the alkali metal compound is 40% or less by mol of a total mol number of the sample.

16. The process for producing a corundum crystal formed body according to claim 6, wherein a mol number of the raw material is 10% or less by mol of a total mol number of the sample.

* * * * *